United States Patent
Narla et al.

(10) Patent No.: US 10,097,005 B2
(45) Date of Patent: Oct. 9, 2018

(54) SELF-CONFIGURING PHOTO-VOLTAIC PANELS

(71) Applicant: SolarCity Corporation, San Mateo, CA (US)

(72) Inventors: Sandeep Narla, San Jose, CA (US); Alex Mayer, San Francisco, CA (US); Brett Alten, Cupertino, CA (US)

(73) Assignee: SolarCity Corporation, San Mateo, CA (US)

( * ) Notice: Subject to any disclaimer, the term of this patent is extended or adjusted under 35 U.S.C. 154(b) by 177 days.

(21) Appl. No.: 14/828,048

(22) Filed: Aug. 17, 2015

(65) Prior Publication Data

US 2017/0054406 A1    Feb. 23, 2017

(51) Int. Cl.
| | |
|---|---|
| *H02J 3/38* | (2006.01) |
| *G05B 15/02* | (2006.01) |
| *H02S 10/00* | (2014.01) |
| *H01R 29/00* | (2006.01) |

(52) U.S. Cl.
CPC .............. *H02J 3/383* (2013.01); *G05B 15/02* (2013.01); *H02J 3/386* (2013.01); *H02S 10/00* (2013.01); *H01R 29/00* (2013.01); *Y02E 10/563* (2013.01); *Y02E 10/763* (2013.01)

(58) Field of Classification Search
CPC .......... H02J 3/383; H02J 3/386; H02S 10/00; G05B 15/02; H01R 29/00
See application file for complete search history.

(56) References Cited

U.S. PATENT DOCUMENTS

| | | | |
|---|---|---|---|
| 4,424,559 A | 1/1984 | Lorincz et al. | |
| 7,161,483 B2 | 1/2007 | Chung | |
| 7,977,818 B1 | 7/2011 | Wahl | |
| 8,401,709 B2 | 3/2013 | Cherian et al. | |
| 8,604,330 B1 | 12/2013 | Hennessy et al. | |
| 8,996,191 B2 | 3/2015 | Carlson et al. | |
| 9,627,861 B2 | 4/2017 | Cruz | |
| 2008/0217998 A1 | 9/2008 | Parmley | |
| 2010/0043862 A1 | 2/2010 | Croft | |
| 2010/0043870 A1* | 2/2010 | Bennett | H02S 40/34 136/251 |
| 2011/0046792 A1 | 2/2011 | Imes et al. | |
| 2011/0273020 A1 | 11/2011 | Balachandreswaran et al. | |

(Continued)

FOREIGN PATENT DOCUMENTS

WO    2014/169295 A1    10/2014

OTHER PUBLICATIONS

Solar Power Engineering, Solar Panels Taking on New and Creative Shapes. Jun. 25, 2010. Online. Article. p. 1. <URL: http://www.solarpowerworldonline.com/2010/06/solar-panels-taking-on-new-and-creative-shapes/>.*

(Continued)

*Primary Examiner* — Robert E Fennema
*Assistant Examiner* — Marzia T Monty
(74) *Attorney, Agent, or Firm* — Kilpatrick Townsend & Stockton LLP

(57) ABSTRACT

Methods and apparatus for controlling an energy-generation device may be provided. Sockets of the device may be configured to electrically couple to respective energy-generation modules. In some examples, the device may include a connector, memory, and a processor configured to execute instructions for managing the electrical configuration of the sockets.

20 Claims, 12 Drawing Sheets

(56) References Cited

U.S. PATENT DOCUMENTS

| | | |
|---|---|---|
| 2012/0033392 A1 | 2/2012 | Golubovic et al. |
| 2012/0112557 A1 | 5/2012 | Sager |
| 2012/0310427 A1 | 12/2012 | Williams et al. |
| 2012/0313455 A1* | 12/2012 | Latham ............. H01L 31/02021 307/117 |
| 2013/0033112 A1 | 2/2013 | Thompson |
| 2013/0246010 A1 | 9/2013 | Dershowitz et al. |
| 2013/0249297 A1* | 9/2013 | Takehara ................. H02J 1/00 307/71 |
| 2013/0269181 A1 | 10/2013 | McBride et al. |
| 2014/0001865 A1 | 1/2014 | Osterloh et al. |
| 2014/0060616 A1 | 3/2014 | Okandan et al. |
| 2014/0130840 A1 | 5/2014 | Hinners et al. |
| 2014/0312700 A1 | 10/2014 | Catthoor et al. |
| 2014/0331198 A1 | 11/2014 | Bischoff et al. |
| 2015/0001945 A1 | 1/2015 | Estes |
| 2015/0001963 A1 | 1/2015 | Georgopapadakos et al. |
| 2015/0244306 A1 | 8/2015 | Estes |
| 2016/0181752 A1 | 6/2016 | Parks et al. |
| 2016/0236634 A1 | 8/2016 | Parks et al. |
| 2017/0187328 A1 | 6/2017 | Miljkovic et al. |

OTHER PUBLICATIONS

Non-Final Office Action dated Oct. 23, 2014 in U.S. Appl. No. 13/553,653, filed Jul. 19, 2012. 38 pages.

International Search Report and Written Opinion dated Oct. 24, 2016 in PCT Application No. PCT/US2016/043921; 10 pages.

Velasco-Quesada, Guillermo et al.; "Electrical PV Array Reconfiguration Strategy for Energy Extraction Improvement in Grid-Connected PV Systems"; IEEE Transactions on Industrial Electronics; Nov. 2009; vol. 56, No. 11; pp. 4319-4331.

Storey, Jonathan et al.; "The Optimized-String Dynamic Photovoltaic Array"; IEEE Transactions on Power Electronics; Apr. 2004; vol. 29, No. 4; pp. 1768-1776.

Non-Final Office Action dated Jul. 5, 2017 in U.S. Appl. No. 14/828,035, filed Aug. 17, 2015. 11 pages.

Final Office Action dated Nov. 6, 2017 in U.S. Appl. No. 14/828,035, filed Aug. 17, 2015. 13 pages.

Non-Final Office Action dated May 7, 2018 in U.S. Appl. No. 14/828,035, filed Aug. 17, 2015. 15 pages.

* cited by examiner

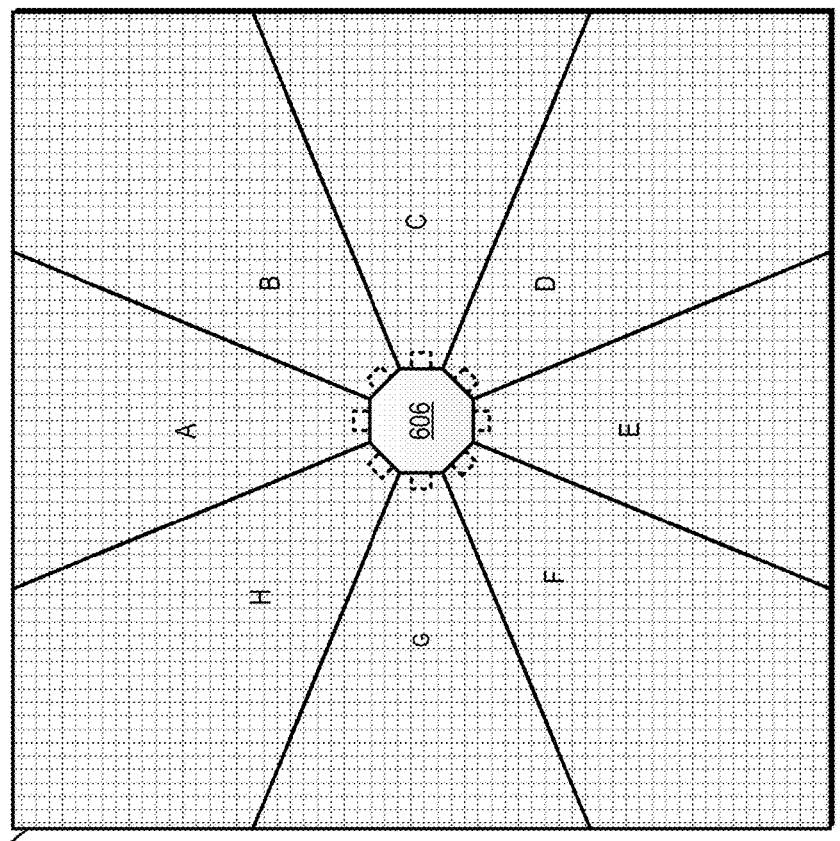
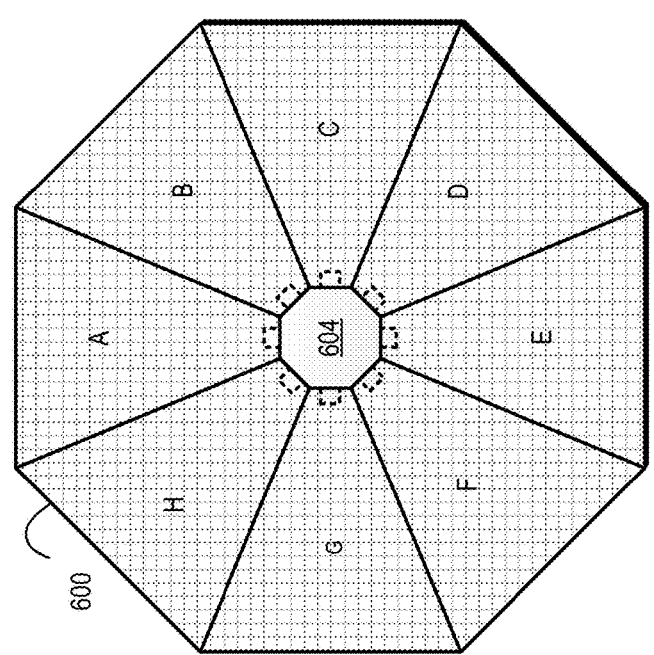
FIG. 6

SELF-CONFIGURING PHOTO-VOLTAIC PANELS

CROSS-REFERENCE TO RELATED APPLICATIONS

This is related to U.S. patent application Ser. No. 14/828,035, filed Aug. 17, 2015 entitled "ENERGY GENERATION INTERCONNECTION," the entire contents of which is hereby incorporated by reference as if fully set forth herein.

BACKGROUND

In recent years, climate awareness and the cost of energy has increased to the point that many consumers have begun to install renewable energy generation systems at both residential and non-residential locations. Solar photovoltaic (PV) systems, for example, have become relatively popular and can be connected to an inverter for converting the energy into a usable source for the location. However, most of these PV systems includes PV panels that are statically connected and hard-wired to one another. As such, if conditions at the location, or energy demands/requirements from a grid or the inverter, change, the PV systems may not be equipped to handle this. Additionally, connection devices that can be used to connect multiple panels into an array may not be able to adapt to changes in physical configuration or when panels of the array degrade or fail.

BRIEF SUMMARY

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

According to one embodiment, a solar panel is described. In some examples, the solar panel may comprise a structure configured to support a plurality of energy-generation cells and including at least one socket configured to electrically couple to at least one additional solar panel or an inverter, a memory for storing computer-executable instructions, and a processor configured to access the memory and execute the computer-executable instructions. In some cases, the processors may at least identify a total number of additional solar panels electrically coupled together that form a solar array. The processors may also identify a first electrical configuration of the solar array and/or receive electrical performance characteristics of each solar panel of the solar array. In some cases, the processors may also determine, based at least in part on the electrical performance characteristics and an optimal energy output amount, a second electrical configuration for the solar array and/or configure electrical connectivity of the at least one socket based at least in part on the determined second electrical configuration.

In some aspects, the solar panel may comprise a plurality of photo-voltaic cells. Additionally, the solar panel may also comprise a plurality of connection devices comprising at least one of a relay or a switch, where each connection device of the plurality of connection devices may be configured to connect the at least one additional solar panel for configuring the electrical connectivity. The first electrical configuration of the at least one socket may comprise a first combination of series and/or parallel arrangements between the solar panel and the at least one additional solar panel. The second electrical configuration of the at least one socket may comprise a second combination of series and/or parallel arrangements between the solar panel and the at least one additional solar panel that is different from the first combination of series and/or parallel arrangements. In some examples, the panel comprise a communication device configured to receive information from a second solar panel and/or the processors may be configured to determine the second electrical configuration based at least in part on the information received from the second solar panel.

According to another embodiment, an energy-generation panel is described. The panel may comprise a structure configured to support a plurality of energy-generation cells and including one or more sockets configured to receive and electrically couple to one or more additional energy-generation panels, a memory for storing computer-executable instructions, and/or a processor configured to access the memory and execute the computer-executable instructions to at least manage electrical connections of the one or more sockets. In some aspects, the processors may also receive electrical performance characteristics of an energy-generation system, the energy-generation system comprising at least the energy-generation panel electrically coupled to the one or more additional energy-generation panels and/or configure electrical connectivity of the one or more sockets in any combination of series and parallel arrangements based at least in part on the electrical performance characteristics of the energy-generation system.

In some examples, the configured combination of series and parallel arrangements of the one or more sockets may be different from a second combination of series and parallel arrangements of the one or more sockets that was configured prior to receipt of the electrical performance characteristics. Additionally, the second combination of series and parallel arrangements may be less efficient than the configured combination of series and parallel arrangements associated with the configured electrical connectivity of the one or more sockets. In some examples, the panel may also comprise means for measuring the electrical performance of the energy-generation system. The panel may also comprise a communication device configured to receive information from a second energy-generation panel and the communication device may receive the information over a wireless network or through an electrical coupling between the energy-generation panel and the second energy-generation panel.

In another embodiment, a method for managing connections between an energy-generation panel and additional energy-generation panels electrically coupled to sockets of the energy-generation panel is described. In some examples, electrical performance characteristics of an energy-generation array comprising the energy-generation panel and the additional energy-generation panels may be received. Additionally, an electrical configuration for the sockets may be determined based at least in part on the electrical performance characteristics and an output factor. Further, electrical connectivity of the sockets may be configured to connect at least a subset of panels that make up the energy-generation array based at least in part on the determined electrical configuration.

In some examples, the electrical performance characteristics may be received from a server computer configured to measure the electrical performance of the energy-generation array. Additionally, a request for operational performance of the energy-generation panel may be received from the server computer. In some aspects, the request may be received based at least in part on a schedule or a trigger. The arrangement may comprise a combination of series and parallel arrangements and/or the energy generation panel may have a first shape that is different from a second shape of at least one of the additional energy-generation panels.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

FIG. 6 is another simplified block diagram illustrating at least some additional features associated with controlling the smart interconnect device as described herein, according to at least one example.

DETAILED DESCRIPTION

Figure 1:
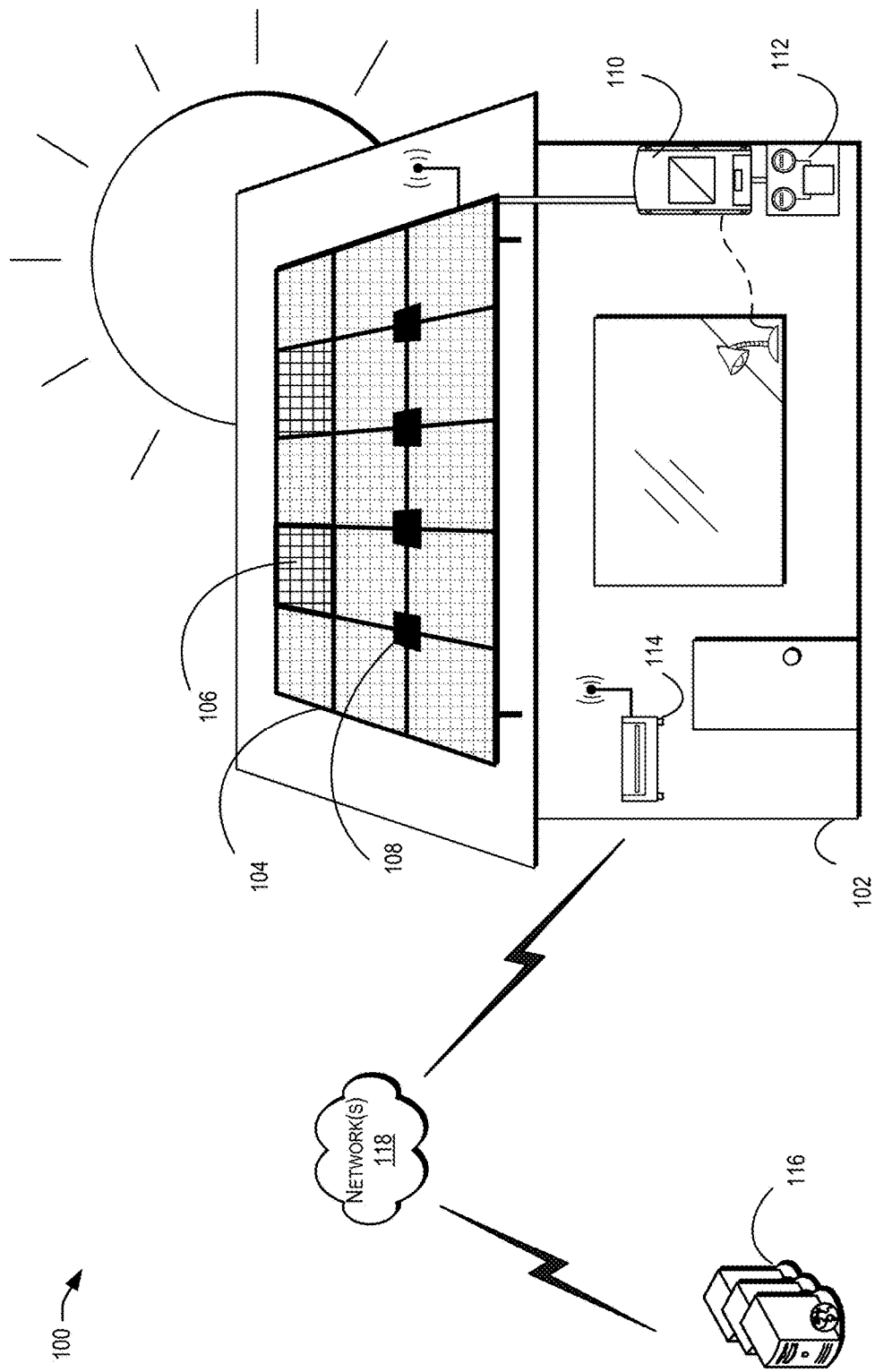
FIG. 1 is a simplified block diagram illustrating an example architecture and environment for controlling smart energy-generation devices as described herein, according to at least one example.

In the following description, various examples will be described. For purposes of explanation, specific configurations and details are set forth in order to provide a thorough understanding of the examples. However, it will also be apparent to one skilled in the art that the examples may be practiced without the specific details. Furthermore, well-known features may be omitted or simplified in order not to obscure the examples being described.

Examples of the present disclosure are directed to, among other things, energy-generation connection devices. In some examples, an energy-generation connection device may be a smart interconnect device (smart interconnection device) designed to connect one or more energy-generation modules, nodes, panels, cells, etc. in such a way that the electrical configuration of each connected energy-generation module are easily connected and/or changed. In other words, a system that controls the energy-generation connection device may receive and/or identify a change in environmental conditions, and dynamically and/or remotely optimize the electrical configuration of the connected modules, perhaps based on the environmental conditions. For example, the electrical configuration of the modules may have included some particular combination of series and parallel, and that configuration may be changed to all series, all parallel, or some other combination of series and parallel.

In some examples, the configuration may be changed to match an output requirement (e.g., limitations of the inverter, or the like) or to optimize the output of the array based at least in part on a range, setting, or efficiency standard. In some examples, the energy-generation modules may be PV panels or other sources of energy that can be connected, and the smart interconnect device can connect any number of PV panels. The energy-generation modules may also be any type of distributed energy-generation source that can be connected, controlled, and/or configured. For example, the modules may be any combination of solar, wind, hydro-electric, or stored energy (e.g., batteries) sources. Further, multiple smart interconnect devices may be used to create an array of modules (e.g., panels) that can all be controlled in aggregated modular fashion, where each smart interconnect device may be configured to communicate with one another. In some examples, the smart interconnect device may also be configured to structurally secure the panels of the array together and/or secure the array to a surface, such as a roof. Additionally, in some examples, the devices may be used to connect modules in any conceivable configuration without regard for the electrical connection, and without expecting the connection to change dynamically. In other words, the devices may enable a static configuration that was not determined until the installation. In this way, the smart interconnect devices may enable installation of modules on the fly that are suitable for particular inverters without first defining the output requirements of the system.

In other examples, the energy-generation connection device may be a smart panel (e.g., a PV panel) designed to connect to one or more other panels (smart panel or otherwise) in such a way that the electrical configuration of each connected energy-generation panel may be changed. Similar to the smart interconnection device noted above, the smart panel may be configured or self-configured to change the electrical configuration of the connected modules, including its own configuration. For example, if the smart panel were connected to another panel, the smart panel may be able to change the electrical configuration between itself and the other panel from series to parallel or from parallel to series. Similarly, if the smart panel were connected to another smart panel, the two smart panels would be able to communicate with one another and either one of them could control the electrical configuration of the group (connected panels). Additionally, any number of smart panels could be connected to each other and/or to other non-smart panels as desired. As such, the aggregate voltage and/or amperage of the array could be changed to optimize the output, adapt to environmental conditions, and/or mange degraded or failed panels that are part of the array of connected panels, much like the way that the smart interconnect would be able to optimize the output of any (or a subset) of the modules that are interconnected.

Smart connection devices (e.g., smart interconnects and/or smart panels) may be configured with one or more computing/control systems including at least processors, memory, and/or communication devices. The communication devices may be configured for communicating with other smart connection devices and/or a server accessible over a network (e.g., the Internet or other public or private networks). Further, in some examples, a gateway device may be located at the location (e.g., the location of the smart connection devices and energy-generation panels) and may be configured to facilitate communication between the smart connection devices and the server. Essentially, the gateway device may route signals from the smart connection devices to the server, and vice versa. In some examples, environmental condition changes and/or performance changes may be reported to a remote server. Remote (e.g., at the server) and/or local (e.g., at the device) diagnostic checks may be performed to identify current working conditions or operational data of the system. As such, performance anomalies, failed modules, and/or changed weather conditions may be identified remotely or locally. In some examples, signals may be sent to the smart connection devices periodically and/or based on a trigger (e.g., a request) to request operational information, and diagnostic tests may be performed on the results returned to the server (or servers). As such, modules or other subsets of the system may be monitored, tested, and/or reconfigured without physically visiting the location of the system.

Additionally, the smart connection devices may be able to communicate with one another to discover the layout of the array (e.g., number of panels, topology/arrangement of panels, etc.) and determine an optimal electrical connectivity scheme to maximize the total output. The smart connection devices can intelligently switch panel connectivity (parallel arrangements and/or serial arrangements) in real-time or upon request. For example, if cloud cover obscures portions of a solar farm, the smart connection devices can, in real-time, determine an optimal configuration for the entire array and change the connectivity between the panels to continually optimize performance. In some examples, reconfiguring the electrical connectivity in real-time may include performing the reconfiguration substantially immediately after receiving the environmental conditions (e.g., cloud or other obstruction cover, degraded devices, failed devices, updated inverter or other output requirement, etc.) and/or without receiving a request to reconfigure (e.g., from a user, from a server, etc.). In other words, the smart connection device may receive a signal identifying an environmental condition change, determine a new configuration, and reconfigure the connectivity of the connected panels, without physically re-arranging the panel positions.

FIG. 1 shows example location 100 where one or more smart connection devices may be installed. In this example, residential building 102 may be equipped with array 104 of PV panels installed on the roof. However, as desired, array 104 may be installed on any part of building 102 and/or may be in any geometric configuration (e.g., square, rectangular, "L" shaped, etc.). In some examples, array 104 may be made of any combination of smart PV panels 106, smart interconnection devices 108, and/or standard (e.g., non-smart) PV panels. The cross-hatched pattern of smart panel 106 and the other panels illustrates that the panels may be configured with a plurality of electrically connected PV cells (e.g., the panel may be a frame that supports the PV cells) and provides one or more electrical outputs (voltage and current) for the panel based at least in part on the aggregate energy generated by the cells.

In some examples, array 104 may be electrically connected to inverter 110 and/or metering device 112. Inverter 110 may be configured to receive direct current (DC) electricity from array 104 and convert it to alternating current (AC) electricity for residence 102 (e.g., to provide electricity to appliances or other electronic devices at location 100). In some examples, inverter 110 may require a particular voltage output or range of voltage output from array 104. As such, if inverter 110 is updated or changed, the output requirements may change. As described, smart interconnect device 108 and/or smart panel 106 may be configured to communicate with one another and/or to detect the configuration of array 104. In this way, when conditions change (e.g., new inverter, weather changes, etc.), total output (voltage and/or current) of array 104 may be dynamically changed in real-time. The new voltage and/or current may be optimized for the new conditions.

In some examples, an array of panels may be installed on a roof (or other location) of a building. The panels may be placed in such a way that they fill up the available space without any consideration for the output requirements at the location. Using smart interconnect devices 106 and/or smart panels 108 as described herein, the array (e.g., through wired or wireless communication modules of smart devices 106, 108) may be able to communicate with gateway device 114 and/or service provider computer 116 through one or more networks 118. Once installed, service provider computers 116 may be configured to provide instructions to smart devices 106, 108 to change, redirect, or otherwise optimize the electrical output of the array. Additionally, service provider 116 may periodically (or based on a trigger) run diagnostic tests on and/or measure the electrical performance of the array. Measurements may be performed by local or remote metering devices (e.g., multi-meters, volt meters, or the like that are configured with terminals coupled to the sockets and/or modules of the system. Using communication with service provider computers 116 and/or based at least in part on logic implemented by smart devices 106, 108, the electrical configuration of the panels may be dynamically updated at any time to accommodate changing conditions (failed panels, faulty wiring, cloud cover, tree cover, animal interference, etc.). As such, the output of a single module (panel) of array 104 may be turned off, deactivated, or otherwise routed around to isolate the modules effect on array 104. Additionally, portions of modules may be controlled to provide more granular/modular control of array 104. For example, strings or individual PV cells may be turned off, turned on, reconfigured to series or parallel, or the like.

Figure 2:
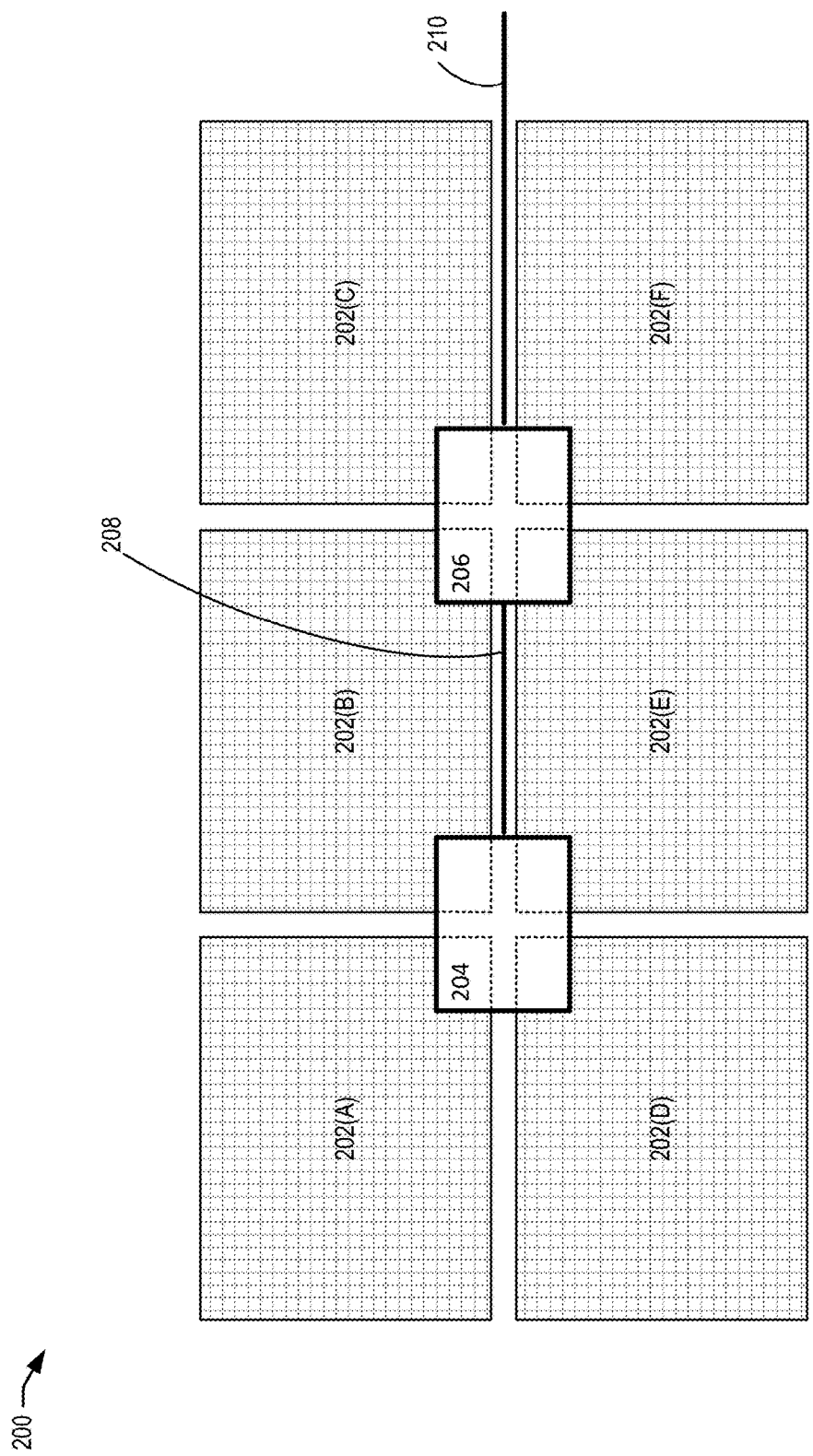
FIG. 2 is another simplified block diagram illustrating at least some features associated with controlling a smart interconnect device as described herein, according to at least one example.

FIG. 2 shows example array 200 that includes six PV panels 202(A)-202(F) (collectively, "panels 202") connected together by a pair of smart interconnect devices 204, 206. In this example, smart interconnect devices 204, 206 may enable all six PV panels 202 to be electrically coupled and also dynamically updated. As such, if the maximum possible voltage output is desired (or required), each of PV panels 202(A)-202(F) may be electrically configured to be connected in series. Alternatively, if the maximum possible amperage output is desired (or required), each of PV panels 202(A)-202(F) may be electrically configured to be connected in parallel. Additionally, as desired, any combination of series and parallel arrangements may be utilized (configured by smart interconnect devices 204, 206) to provide the desired output.

In some examples, smart interconnect devices 204, 206 may be communicatively connected to each other via electrical cabling 208, which may be integrated into the panels, or separately provided or routed between or behind the panels, for example. These cables can carry signals, power, or both. However, in other examples, smart interconnect devices 204, 206 may be connected via a wireless connection. Either way, devices 204, 206 may communicate with one another to identify/determine the number of connected PV panels 202, identify/determine the geometric configuration of PV panels 202, and/or change the electrical connections between PV panels 202 in to order to facilitate changes in the electrical output. Additionally, in some examples, the electrical output may be provided to an inverter via one of PV panels 202 (e.g., one of PV panels 202 may be originally configured as the output source) or directly from one of smart interconnect devices 204, 206 (e.g., one of smart interconnect device 206 may be originally configured as the output source) via electrical wire 210.

Using smart interconnect devices 204, 206 with array 200, smart interconnect devices 204, 206 and/or a remote service provider may be able to monitor the efficiency of array 200. For example, at a nominal voltage and current output, array 200 would generally operate efficiently. However, if conditions change, the efficiency of array 200 may decrease. As such, smart devices 204, 206 and/or the service provider may be configured to increase the efficiency by changing the output voltage and current. Some potential variables for determining the optimization of array 200 may include the location or existence of any string-level inverters, and their respective input requirements. Voltage and current may also be regulated by DC/DC inverters connected to each smart interconnect device 204, 206. The updated efficiency may be obtained by changing the electrical connection arrangement (e.g., the number of panels in parallel versus the number of panels in series) of array 200. In some examples, smart devices 204, 206 may enable operation of array 200 as a multi-nodal network that attempts to always find the optimal operational efficiency (voltage and current output). In at least one example, a Monte Carlo simulation may be executed on a current configuration of array 200 to determine the optimal configuration. The optimal configuration (which may be based at least in part on tolerances of the string inverters) may then be implemented by controllers of smart devices 204, 206. Conceptually, array 200 could be considered a grid that could have multiple directions of input and/or output energy, as well as multiple combinations of series and parallel connections. Additionally, in some examples, only two panels (or some number less than all) may be in communication with each other and/or with devices 204, 206. While, in other examples, all of the panels may be in communication with one another and/or with devices 204, 206 (e.g., in a master/slave relationship with devices 204, 206. Yet, in other examples, individual devices 204, 206 may communicate with one another in a non-hierarchical (e.g., mesh) network utilizing any known protocols (e.g., Zigbee or the like).

Figure 3:
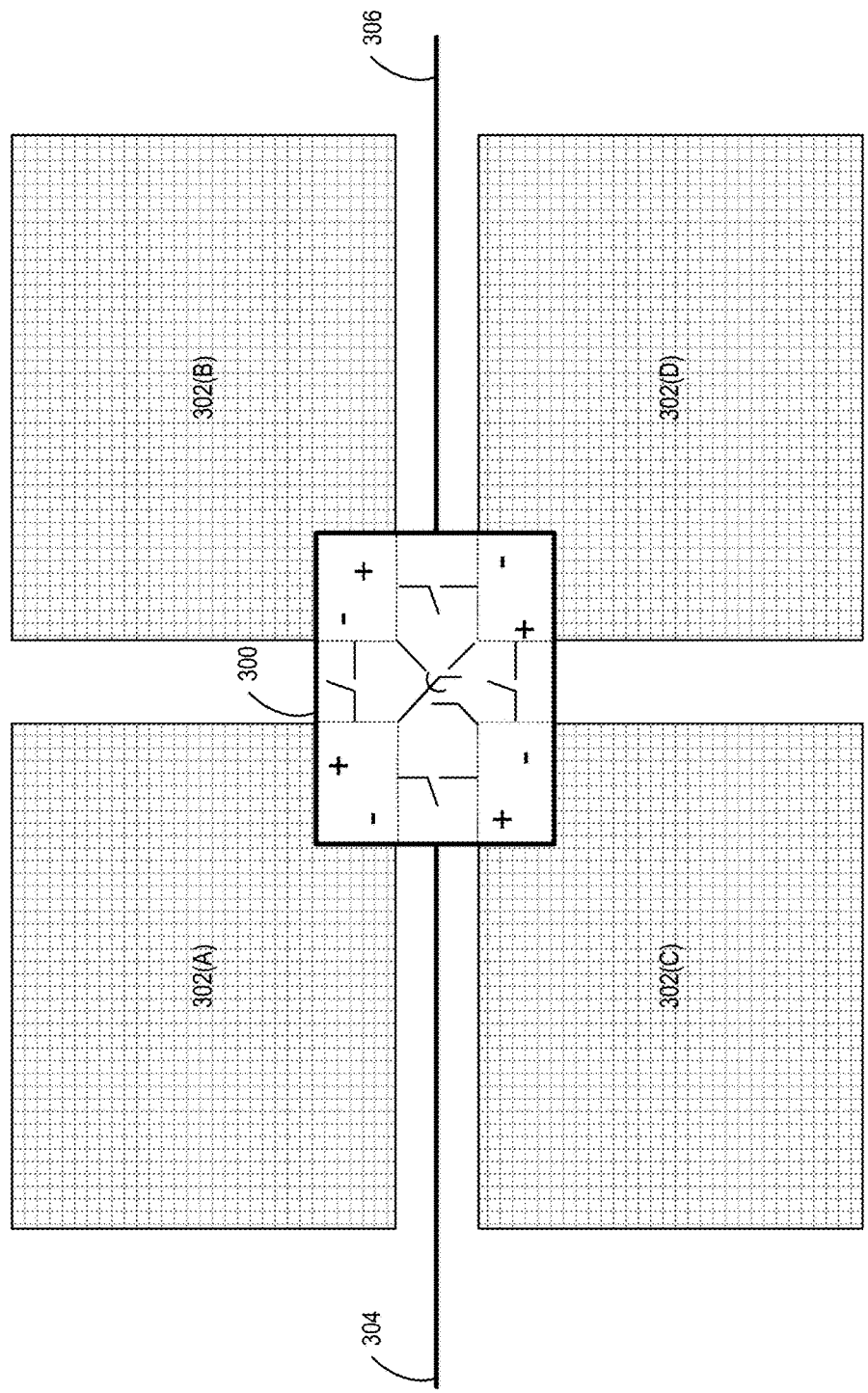
FIG. 3 is another simplified block diagram illustrating at least some additional features associated with controlling the smart interconnect device as described herein, according to at least one example.

FIG. 3 shows example interconnect device 300 that is connected to four different PV panels 302(A)-302(D) (collectively, "panels 302"). As shown here, PV panels 302 can connect to smart interconnect device 300 at respective corners. However, one of ordinary skill in the art would understand that this is just one example of many, and that the form factor of smart interconnect device 300 (e.g., the specific locations of device 300 that physically connect with panels 302) is independent of the dynamic functionality that smart interconnect device 300 provides. Still, using interconnect device 300 of FIG. 3 as an example, PV panels 302 may connect at the corners. Each PV panel 302 may have a positive and a negative terminal for electrically connecting to other PV panels 302, inverters, and/or one or more interconnect devices 300.

In some examples, smart interconnect device 300 may also be configured with positive and negative terminals at each corner (or anywhere else). Each corner (or connection location) of smart interconnect device 300 may also be configured with a socket configured to receive respective PV panels 302. In some embodiments, each socket may be electrically connected to every other socket and/or to one or more input/output cables 304, 306. However, in some embodiments, there may be some sockets that are not connected to others such that not all sockets are always connected. For example, some bare minimum number of connections may be desired, and the interconnection devices may be configured with any number or configuration of connections from the bare minimum to complete connection (e.g., all sockets connected) based at least in part on the needs of the system or the design. Devices with less than all connections will limit the configurability of the system but will make the interconnection device less expensive to manufacture. Further, each of the electrical connections may be configured with a relay, a switch (e.g., solid-state or the like), or any other actuating devices (Mosfets, simple mechanical contactors, gas/chemical actuated devise, etc.) for opening/closing connections between individual connected panels 302. As such, by controlling the relays, the electrical connections may be dynamically changed without disconnecting or manually rewiring or replacing PV panels 302. This permits optimum performance until the damaged or otherwise underperforming PV component is repaired.

Figure 4:
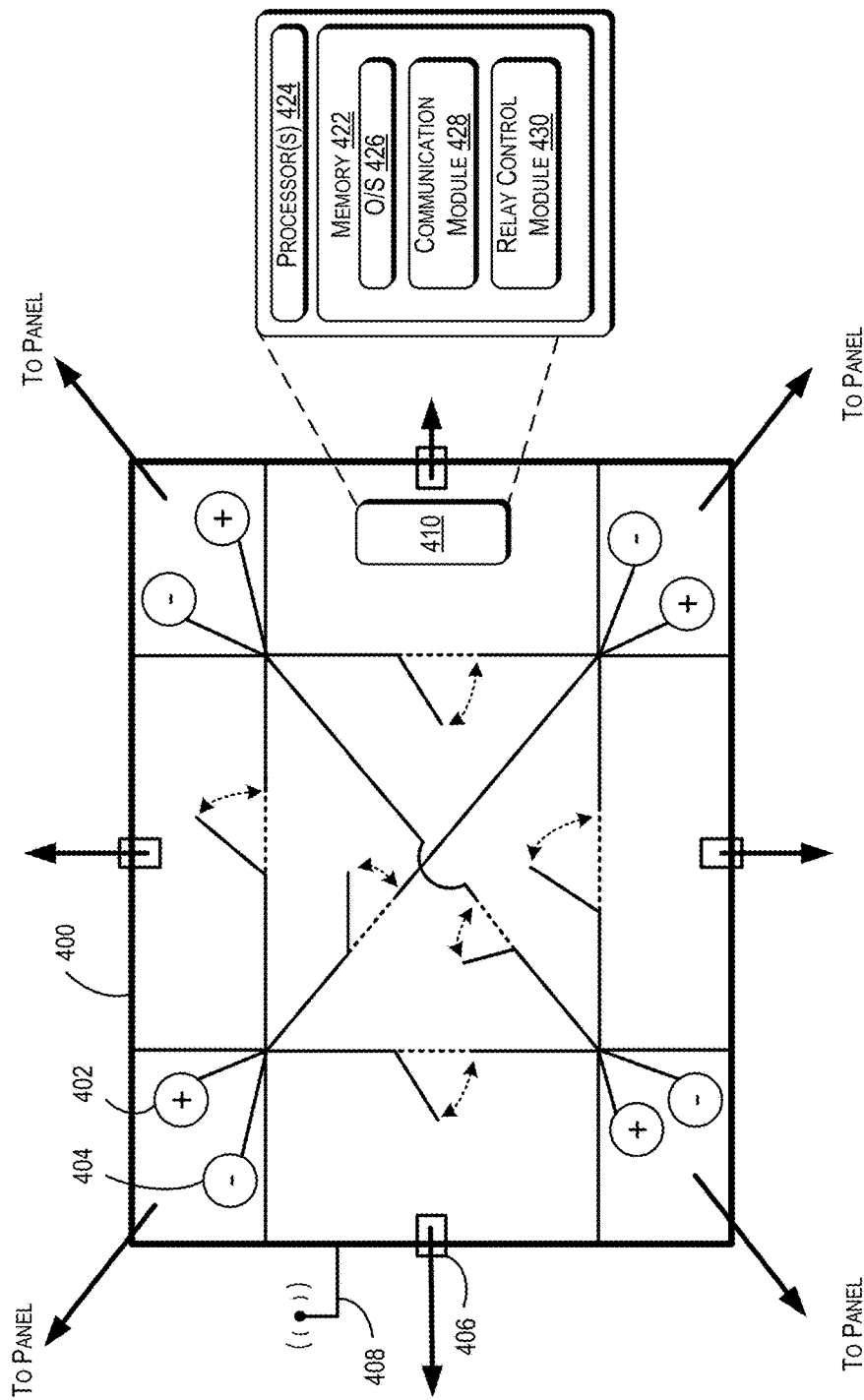
FIG. 4 is another simplified block diagram illustrating at least some additional features associated with controlling the smart interconnect device as described herein, according to at least one example.

FIG. 4 shows another example interconnect device 400, with more internal detail than interconnect device 300. Devices can be used to connect two or more panels, depending on the specific panel design and system requirements. For example, smart interconnect device 400 includes one or more positive and negative sockets 402, 404 for receiving PV panel terminals, input/output terminals 406 for receiving/providing electricity to other panels or interconnect devices and/or for communicating (via powerline communication) with other systems (e.g., other interconnect devices with other connected panels), and at least one wireless radio 408 for potentially communicating with a gateway device, a server, and/or other smart connection devices. Additionally, in some examples, the smart interconnect device may include control module 410 configured to control the relays (switches) in order to optimize the output as desired.

In some cases, control module 410 may include memory 422 and one or more processors 424. Memory 422 may be configured to store computer-executable instructions that, when executed by one or more processors 424, cause control module 410 to change the electrical connectivity (arrangement) of the panels in order to optimize the output of the system. In some examples, memory 422 may store instructions for operating system 426 and/or logic for implementing communication module 428 and/or relay control module 430. Communication module 428, when executed by one or more processors 424, may be configured to communicate with other smart interconnect devices and/or smart panels. Once the communication is established, smart interconnect device 400 may be able to receive information about the system topography, connected panels, environmental conditions, panel/system health, etc. through communication module 428. Additionally, once information has been received through communication module 428, control module 410 may be able to determine an appropriate and/or optimal configuration of the connected PV panels/systems via relay control module 430. Additionally, once the desired configuration is determined, relay control module 430 may be configured to provide instructions for changing the electrical connectivity of the panels by adjusting the relays (switches) of smart interconnect device 400.

In some cases, control module 410 may configured to receive input conditions for configuring the array of panels connected to smart interconnect device 400. The first input condition may include boundary conditions that identify appropriate end voltage and end current for the array (e.g., the array may be configured to not exceed 600 Volts and 10 Amps). The second input condition may be system-to-system conditions, such that each smart interconnect device 400 in the array can communicate their individual configurations (and voltage current outputs). Before each smart interconnect device 400 of the array physically connects with other smart interconnect devices of the array, fault/safety checks may be performed to ensure that the optimized configuration will not exceed the boundary conditions. In some examples, smart interconnect device 400 can be utilized to implement rapid shutdown (e.g., modular-level shorting) of each connected panel. As such, metal-oxide-semiconductor field-effect transistors (MOSFETs) may be utilized as the switches/relays within smart interconnect device 400.

Additionally, in some examples, utilizing smart interconnect device 400, an array of panels may be built with an excess of panels such that any inverter can be attached, and the configuration of the output of the array can be optimized dynamically to meet the input limitations of the inverter. In this way, two stages (one for boosting the voltage and another for converting to AC) may not be needed. Additionally, a fixed voltage may be guaranteed by the array, independent of the number of panels installed in the array. New and/or upgraded inverters may then be installed at the location (even if they have different voltage and current limitations), and the physical configuration and/or number of panels installed in the array will not need to changed. It should be noted that a four-panel connector can be used to connect two, three, or four panels by simply turning off the unused sockets.

Figure 5:
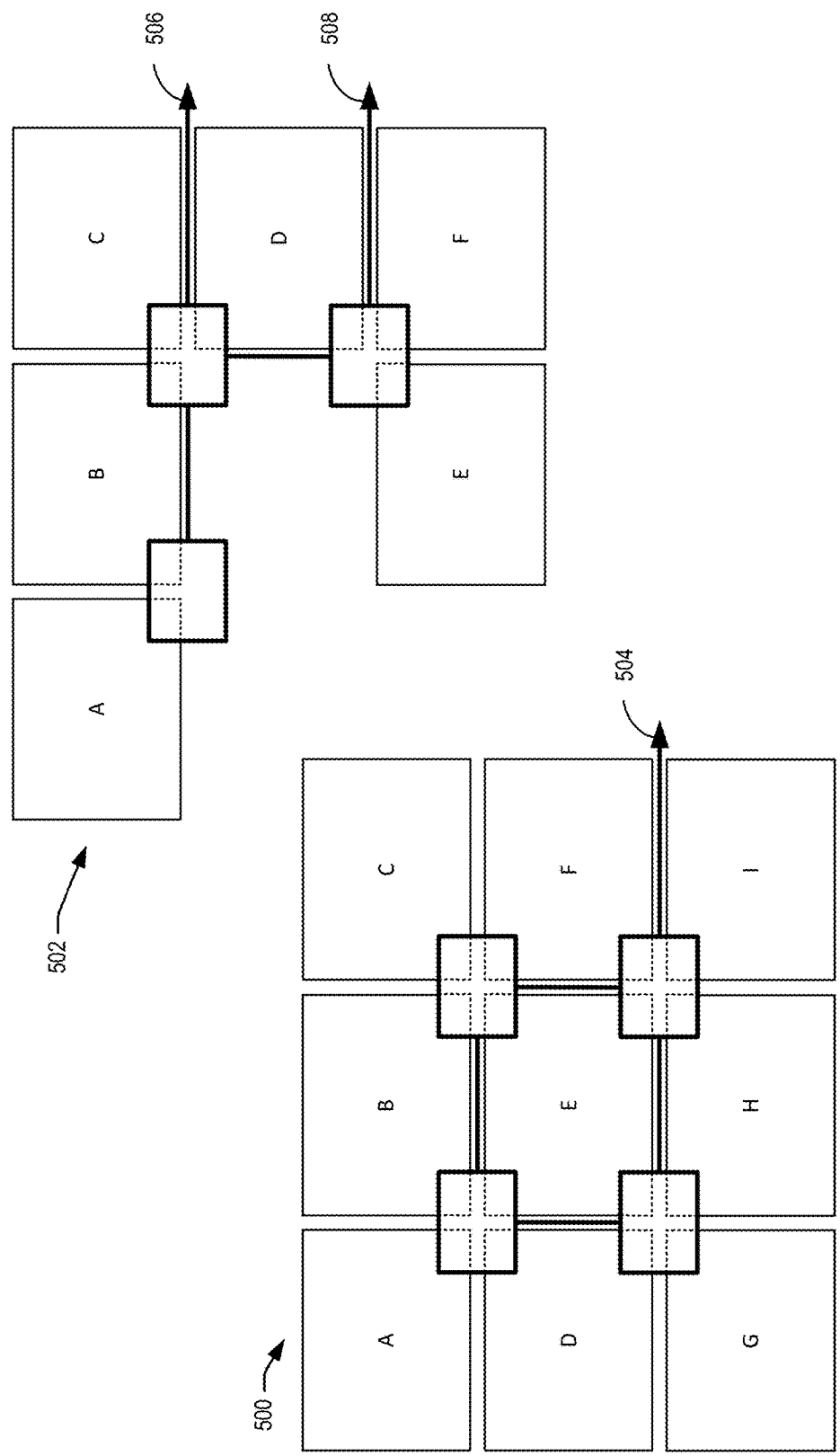
FIG. 5 is another simplified block diagram illustrating at least some additional features associated with controlling the smart interconnect device as described herein, according to at least one example.

FIG. 5 shows two different example arrays 500, 502, each configured differently using smart interconnect devices as described (e.g., each with four corner-connection sockets). In example array 500, all nine panels A-I may be configured in any combination of serial or parallel arrangements as desired. For example, array 500 may originally be configured with each panel A-I in series. However, if clouds cover panels B, C, E, and F, the smart interconnect devices may identify this environmental change, determine a more optimal configuration, and change the relay configurations of each interconnect device to achieve a different arrangement (e.g., A, D, G, H, and I in series, with B, C, E, and F in parallel). Alternatively, in another example, the system (e.g., the aggregate logic of each smart interconnect device in the array) may determine that panel E has failed and is no longer operational. As such, the system may decide to bypass panel E, by controlling the relays to configure an arrangement with panels A, B, C, D, F, G, H, and I in series. In this example, the system (array) may be configured for output to a single inverter at 504.

Much like with array 500, in example array 502, the six panels A-F may be configured in any combination of series or parallel, as desired. Additionally, in some examples, the output may be provided to two different inverters at 506, 508. As such, in some examples, the system may configure panel D to provide energy to the first inverter through 506. However, at a later time, the system may change the output of panel D so that it provides energy to the second inverter through 508. In this way, total control of the output voltage and amperage of the array (or set of arrays) may be attained utilizing the smart interconnect devices. For example, if each of the two inverters requires a particular voltage, but one sub-array (e.g., panels A-D) is not able to provide the particular voltage to the first inverter due to environmental conditions (e.g., panels C and D are covered by a cloud), the system can reroute the generated energy so that panels A and B are added in series to the second sub-array (e.g., panels E and F) to provide energy to the second inverter.

FIG. 6 shows two different example arrays (strings) 600, 602, each configured with eight panels A-H. While rectangular smart interconnect devices (e.g., shown in FIG. 5) and octagonal smart interconnect devices 604, 606 (e.g., shown here in FIG. 6) are shown, any shapes may be built to accommodate any number and/or shape of panels. In example arrays 600, 602, much like above, each of panels A-H may be configured into any combination of series or parallel arrangements. Additionally, the arranged configurations may be changed dynamically and/or in real-time based at least in part on detected environmental conditions or output requirements. Additionally, as shown in FIG. 6, different shaped panels (e.g., panel A and panel B are different shapes) can be combined without consideration of inter-panel configuration to form a string, thus simplifying installation. In other words, any shaped panels may be used, as appropriate, to cover an area (e.g., a roof) without needing each panel to conform to a standard size or shape. In some embodiments, a technician may be able to visit a solar installation site where a roof of unknown shape is located. In this example, the technician may be able to use panels of different shape and size to fit the roof with panels connected by interconnection devices 604, 606 to maximize space or wattage of the system.

Figure 7:
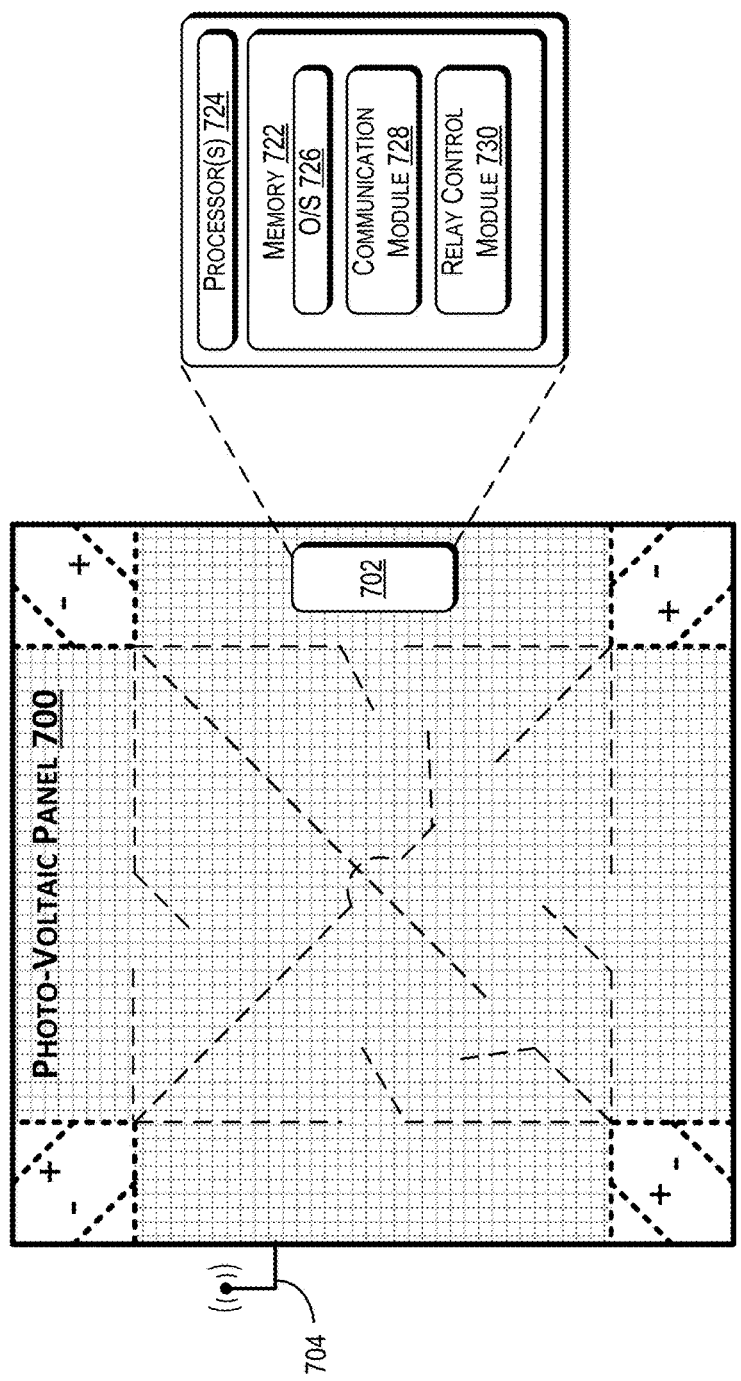
FIG. 7 is another simplified block diagram illustrating at least some features associated with controlling a smart energy-generation panel as described herein, according to at least one example.

FIG. 7 shows example smart panel 700. While much of the discussion above has been with respect to a smart interconnect device configured to optimize the output of an array of PV panels, similar functionality may be achieved with smart panels, such as smart panel 700. For example, smart PV panel 700 may be configured to support a plurality of connected PV cells. As such, each smart panel 700 may be able to provide a particular amount of energy as output on its own. However, smart panel 700 may also be configured to electrically couple with one or more other panels (e.g., other smart panels, other non-smart panels, and/or smart interconnect devices). As shown in FIG. 7, the four corners of smart panel 700 may be configured to couple with other panels; however, any number of couplings and any location of smart panels 700 may be configured to facilitate the coupling. Some panels may be configured with male-end couplings and/or female-end couplings to enable a variety of different physical connection configurations.

In some examples, smart panel 700 may also be configured with internal wiring (e.g., similar to the smart interconnect device 400 of FIG. 4. The wiring may be configured with relays (switches) or other connector devices capable of reconfiguring the other panels that may be coupled to smart panel 700. In order to bypass a panel in a configuration, each panel 700 may be configured with a single wire (and relay) from input to output in such a way that the other connected panels can bypass a faulty panel that is connected. When a bypass is desired, all relays may be opened except for the relay that closes the wire to from the input to the output of the panel. In this way, the electrical connection between the previous panel and next panel can be opened without the electricity running through faulty panel 700 at all. Additionally, the smart panel may be configured with control module 702 configured to optimize the output of smart panel 700 and/or array of connected panels. In some cases, control module 710 may include memory 722 and one or more processors 724. Memory 722 may be configured to store computer-executable instructions that, when executed by one or more processors 724, cause control module 710 to change the electrical connectivity (arrangement) of connected panels in order to optimize the output of smart panel 700. In some examples, memory 722 may store instructions for operating system 726 and/or logic for implementing communication module 728 and/or relay control module 730.

Communication module 728, when executed by one or more processors 724, may be configured to communicate with other smart interconnect devices and/or smart panels. Once the communication is established, smart panel 700 may be able to receive information about the system topography, connected panels, environmental conditions, panel/system health, etc. through communication module 728. Additionally, once information has been received through communication module 728, control module 710 may be able to determine an appropriate and/or optimal configuration of the connected panels via relay control module 730. Additionally, once the desired configuration is determined, relay control module 730 may be configured to provide instructions for changing the electrical connectivity of the panels by adjusting the relays (switches) of smart panel 700.

Figure 8:
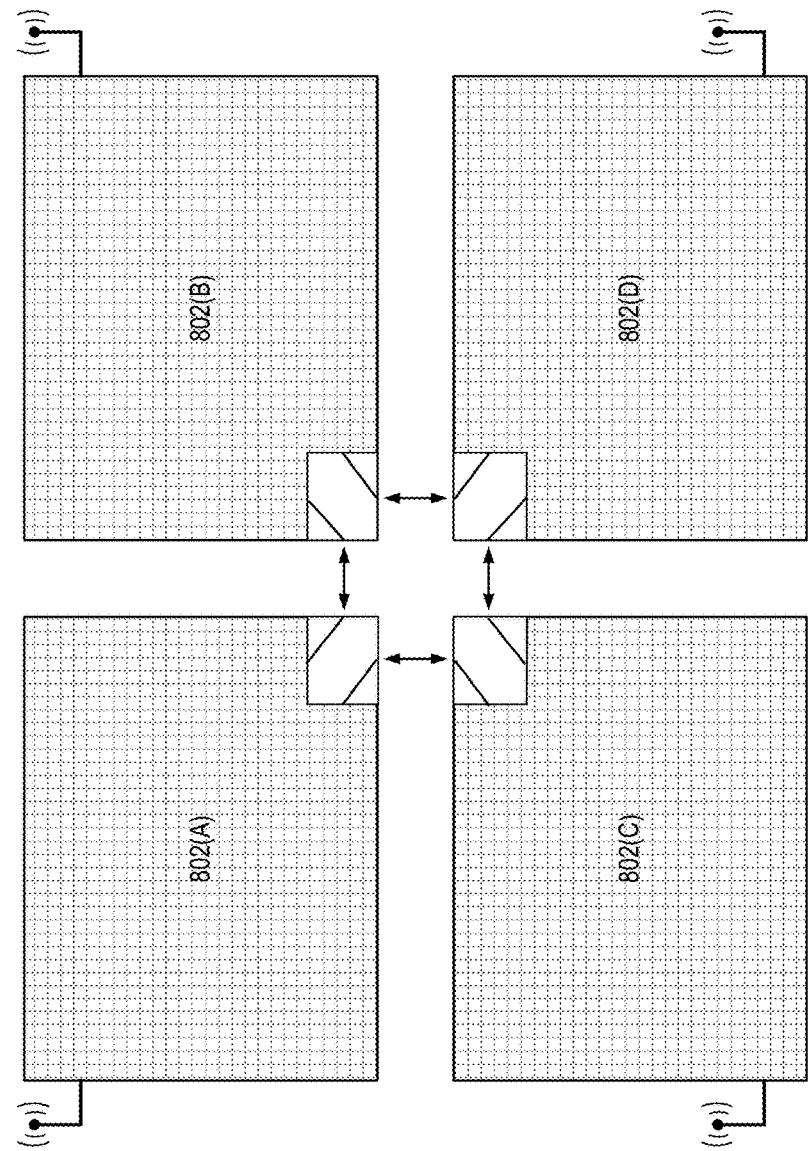
FIG. 8 is another simplified block diagram illustrating at least some additional features associated with controlling the smart energy-generation panel as described herein, according to at least one example.

FIG. 8 shows example configuration 800 of four different smart panels 802(A)-(D) (collectively "smart panels 802"). In some examples, smart panels 802 may be configured such that they have corresponding sockets for easy connection with other smart panels 802. For example, smart panel 802(A) may have a socket for connecting to other smart panels 802 on the bottom right corner, 802(B) may have a socket for connecting to other smart panels 802 on the bottom left corner, and 802(C) may have a socket for connecting to other smart panels 802 on the top right corner. As such, when smart panel 802(A) is attached to smart panel 802(B) in the configuration 800 shown here, the two panels may become electrically and/or communicatively coupled. Similarly, when smart panel 802(A) is attached to smart panel 802(C), they may also become electrically and/or communicatively coupled. In some examples, the smart panels 802 may include male-end and/or female-end couplings so that they physically attach to one another. However, in other examples, smart panels 802 may magnetically snap together, in which case external plates may be positioned such that when the two panels magnetize to one another, the plates line up and are able to connect electrically. Further, smart panels 802 may include radios and/or network interface cards for communicating with one another, with a gateway device, and/or with a server. In some examples, not all connected panels may communicate with one another. For example, panels 802(A)-(D) may all be connected; however, only a subset of the panels may communicate with one another and/or with a server/gateway device.

Figure 9:
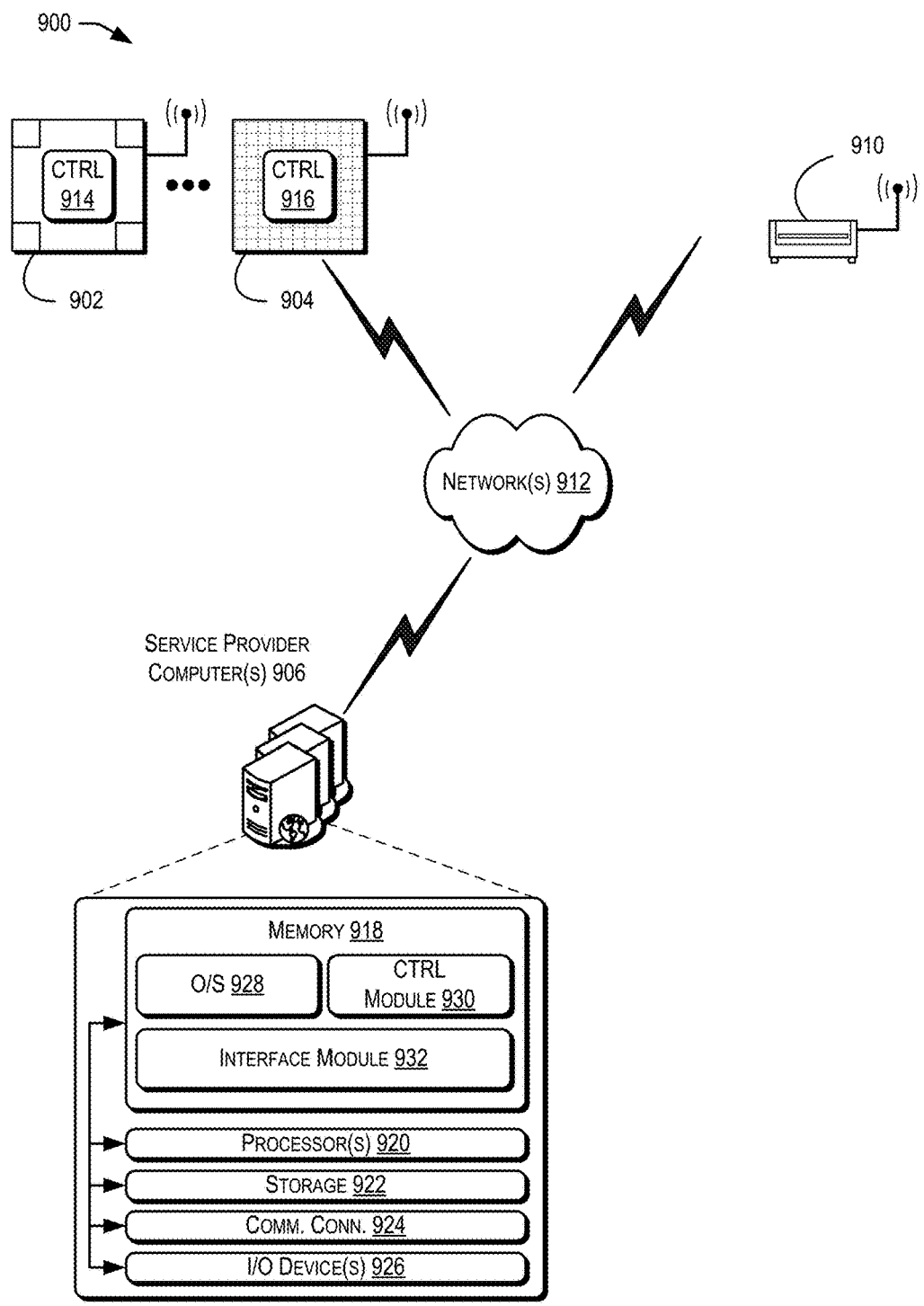
FIG. 9 is another simplified block diagram illustrating an example architecture for implementing the smart interconnect device and/or the smart panel in connection with a service provider as described herein, according to at least one example.

FIG. 9 shows example architecture 900 for controlling smart interconnect devices and/or smart panels. As described herein, example architecture 900 includes smart interconnect devices 902, smart panels 904, service provider computers 906, and/or gateway devices 910 connected via one or more networks 912, according to at least one example. In architecture 900, smart interconnect devices 902 and/or smart panels 904 may communicate directly with one another (e.g., utilizing wired connections or the like) or they may utilize networks 912 (or other networks) to communicate and/or interact with one another. In some aspects, the logic for optimizing the smart connection devices may be performed locally at each smart device 902, 904, or it may be performed by one or more service provider computers 906. In this way, the smart devices may provide information (e.g., current configurations, environmental conditions, etc.) to service provider computers 906 and configure the electrical connections of the connected panels based at least in part on instructions received from service provider computers 906.

Service provider computers 906 may, in some examples, communicate with smart devices 902, 904 through gateway device 910. As such, service provider computer 906 may provide control signals to gateway device 910 for controlling smart devices 902, 904. In some examples, aggregate logic may be utilized to determine a total output of an array that includes one or more smart interconnect devices 902 and/or smart panels 904. This aggregate logic may be implemented locally (e.g., by each smart device 902, 904), by service provider computers 906, or by gateway device 910 (or some other local processor that can communicate with each smart device 902, 904 of the array). As such, gateway device 910 may act as a local controller and may manage aggregate data collected from individual smart devices 902, 904 of each array. Further, in some examples, a single array may be logically divided into sub-arrays (chunks) and each sub-array may be optimized individually, as desired.

In some examples, networks 912 may include any one or a combination of many different types of networks, such as cable networks, the Internet, wireless networks, cellular networks and other private and/or public networks. As described above, smart interconnect device 902 and smart panel 904 may each be configured with control module 914, 916, respectively. Control modules 914, 916 may be responsible for controlling the output of an array of panels connected to the either smart interconnect device 902 (or an array of panels with at least one smart interconnect device 902) or smart panel 904 (or an array of panels with at least one smart panel 904).

Service provider computers 906 may be any type of computing devices such as, but not limited to a server computer, a personal computer, a smart phone, a personal digital assistant (PDA), a thin-client device, a tablet PC, etc. In some examples, service provider computers 906 may be in communication with smart devices 902, 904 via networks 912 and/or through gateway device 901, or via other network connections. Additionally, service provider computers 906 may be part of a distributed system.

In one illustrative configuration, service provider computers 906 may include at least one memory 918 and one or more processing units (or processor(s)) 920. The processor(s) 920 may be implemented as appropriate in hardware, computer-executable instructions, firmware, or combinations thereof. Computer-executable instruction or firmware implementations of processor(s) 920 may include computer-executable or machine-executable instructions written in any suitable programming language to perform the various functions described.

Memory 918 may store program instructions that are loadable and executable on processor(s) 920, as well as data generated during the execution of these programs. Depending on the configuration and type of service provider computers 906 and/or smart devices 902, 904, memory 918 and/or memory of smart devices 902, 904 may be volatile (such as random access memory (RAM)) and/or non-volatile (such as read-only memory (ROM), flash memory, etc.). Devices 902, 904, 906 may also include additional storage (e.g., storage 922), which may include removable storage and/or non-removable storage. Additional storage 922 may include, but is not limited to, magnetic storage, optical disks, and/or tape storage. The disk drives and their associated computer-readable media may provide non-volatile storage of computer-readable instructions, data structures, program modules, and other data for computing devices 902, 904, 906. In some implementations, the memory of the devices (e.g., memory 918 or the memory of smart devices 902, 904) may include multiple different types of memory, such as static random access memory (SRAM), dynamic random access memory (DRAM), or ROM.

The memory, the additional storage, both removable and non-removable, are all examples of computer-readable storage media. For example, computer-readable storage media may include volatile or non-volatile, removable or non-removable media implemented in any method or technology for storage of information such as computer-readable instructions, data structures, program modules, or other data. The memory and the additional storage are all examples of computer-readable storage media. Additional types of computer-readable storage media that may be present in user devices 902, 904, 906 may include, but are not limited to, PRAM, SRAM, DRAM, RAM, ROM, EEPROM, flash memory or other memory technology, CD-ROM, DVD or other optical storage, magnetic cassettes, magnetic tape, magnetic disk storage or other magnetic storage devices, or any other medium which can be used to store the desired information and which can be accessed by devices 902, 904, 906. Combinations of any of the above should also be included within the scope of computer-readable storage media.

Alternatively, computer-readable communication media may include computer-readable instructions, program modules, or other data transmitted within a data signal, such as a carrier wave, or other transmission. However, as used herein, computer-readable storage media does not include computer-readable communication media.

Devices 902, 904, 906 may also contain communications connection(s) (e.g., communication connections 924) that allow devices 902, 904, 906 to communicate with other smart devices, a stored database, another computing device or server, user terminals and/or other devices on the networks 912. Devices 902, 904, 906 may also include I/O device(s) (e.g., I/O device 926), such as a keyboard, a mouse, a pen, a voice input device, a touch input device, a display, speakers, a printer, etc.

Turning to the contents of memory 918 in more detail, memory 918 may include operating system 928 and one or more application programs or services for implementing the features disclosed herein including at least control module 930 and interface module 932. In some cases, control module 930 may be configured to determine appropriate configurations for the electrically connected panels of smart interconnect devices 902 and/or smart panels 904. For example, control module 930 may receive environmental conditions and current configuration information, and utilizing that information (and/or some output requirements or thresholds), may determine appropriate electrical connection arrangements (e.g., combinations of series and/or parallel) for connected PV panels. Once determined, control module 930 may provide control signals back to smart devices 902, 904 for implementation. In some examples, interface module 932 may be configured to provide a user interface to one or more user devices. For example, interface module 932 may communicate with one or more user devices to receive user-defined configuration information for controlling smart devices 902, 904. In this way, a user of the smart devices may set thresholds, rules, and/or configuration settings for smart devices 902, 904.

Gateway device 910 may also be any type of computing device such as, but not limited to, a router or other computing device configured to share information between two or more network-connected devices. In some examples, gateway device 910 may be in communication with smart devices 902, 904 and/or service providers via networks 912, or via other network connections.

Figure 10:
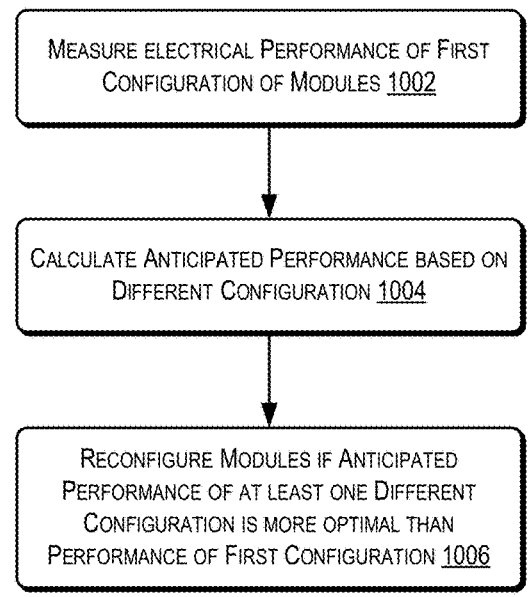
FIG. 10 is a simplified flow diagram illustrating an example process associated with controlling the smart interconnect device described herein, according to at least one example.
Figure 11:
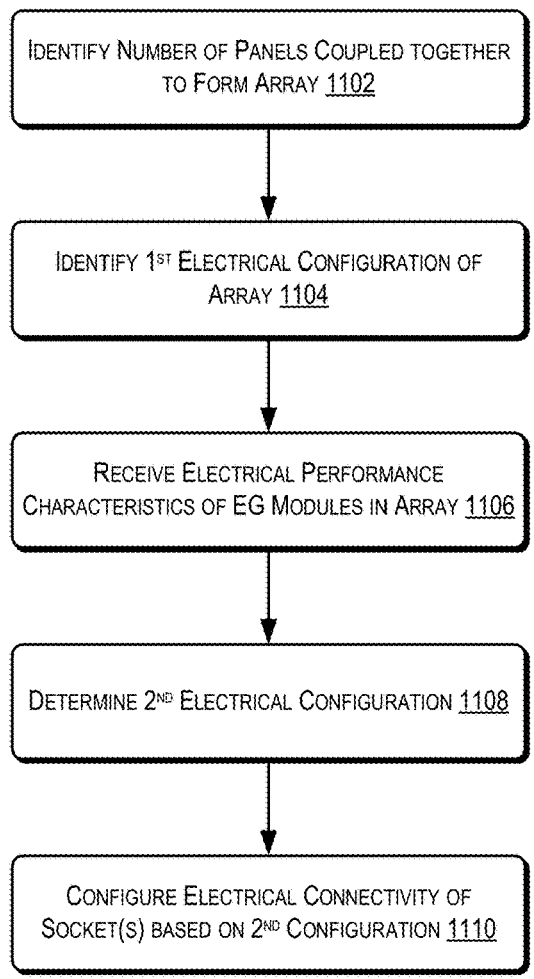
FIG. 11 is a simplified flow diagram illustrating an example process associated with controlling the smart panel described herein, according to at least one example.

FIGS. 10 and 11 show example flow diagrams of respective processes 1000 and 1100 for controlling smart devices to optimize output, as described herein. Processes 1000 and 1100 are illustrated as logical flow diagrams, each operation of which represents a sequence of operations that can be implemented in hardware, computer instructions, or a combination thereof. In the context of computer instructions, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular data types. The order in which the operations are described is not intended to be construed as a limitation, and any number of the described operations can be combined in any order and/or in parallel to implement the processes.

Additionally, some, any, or all of the processes may be performed under the control of one or more computer systems configured with executable instructions and may be implemented as code (e.g., executable instructions, one or more computer programs, or one or more applications) executing collectively on one or more processors, by hardware, or combinations thereof. As noted above, the code may be stored on a computer-readable storage medium, for example, in the form of a computer program comprising a plurality of instructions executable by one or more processors. The computer-readable storage medium is non-transitory.

In some examples, one or more processors (e.g., processors 424) of smart interconnect device 400 of FIG. 4, may perform method 1000 of FIG. 10. Method 1000 may begin at 1002, where an interconnect device (e.g., smart interconnect device 400) or a server computer in communication with smart interconnect device 400 may measure the electrical performance of a first configuration of one or more sockets or modules connected to the interconnection device. For example, each socket may be coupled to a PV panel, and may be configured for one of parallel or serial connectivity with an adjacent (or other connected) PV panel. As such, the first configuration may identify a particular arrangement of series and/or parallel connections between PV panels connected to the smart interconnect device or part of an array of PV panels at least indirectly connected to the smart interconnect device. As such, a measurement may be taken of the performance of the array or string of panels and/or of the output of the system. Performance measurements may identify current electrical characteristics of the system (e.g., voltage, current, power, resistance, impedance, etc.). In some examples, the system and/or individual modules (panels) may be measured at night (e.g., when not collecting solar energy) or at other times while not producing energy. Additionally, in some examples, output of a single module or circuit may be turned off or otherwise deactivated so as to isolate the modules effect on performance of the system. The electrical performance characteristics may identify a level of performance (e.g., healthy, degrading, a percentage of full performance, etc.) of each individual PV panel or of the entire array connected to the smart interconnect device. Additionally, the electrical performance characteristics may identify environmental changes such as cloud cover or other obstructions to the connected panels At 1004, the smart interconnect device or server may calculate anticipated performance of the system based on one or more different configurations of the system. For example, the device or server managing the configurations of the system may simulate any number of different possible configurations of the system, and then calculate the performance (anticipated) for each of those particular different configurations. In some examples, a calculation may be performed for every possible configuration given the connected set of operational modules (e.g., those connected to the interconnection device). However, in other examples, only a subset of the possible configurations may be tested (calculated). Thus, an anticipated performance of any configuration may be an expected level of output voltage or current given a simulation and/or mathematical calculation of that configuration. For example, if a system has three PV panels in series, the first configuration may be set to have all three panels in series. Thus, the electrical performance of this configuration may be measured at 1002. Then, at 1004, several calculations may be performed to determine anticipated performance for configurations with the three panels in parallel, with one or more panels disconnected, or with some combination of series and parallel arrangements.

At 1006, the smart interconnect device or server may reconfigure the system (change the relays internally or send a signal to the interconnection device to have the relays changed) to a new configuration that matches a particular different configuration if the anticipated performance for that particular different configuration is better (more optimal or desired based at least in part on the inverter being used) than the measured performance of the first configuration. In some examples, the different configuration with the best performance may be selected (i.e., the system will be reconfigured to match that particular configuration) or some other different configuration. Selection of the appropriate different configuration (for reconfiguring the system) may be based at least in part on inverter constraints, external factors, or customer/designer preference. Further, the determination may be based at least in part on the electrical performance characteristics and/or an optimal energy output amount. The optimal energy output amount may be determined based at least in part on inverter requirements, grid requirements, best practices, settings, ranges, or efficiency standards.

FIG. 11 shows an example flow diagram for method 1100 for controlling a smart energy-generation panel (e.g., a smart PV panel), as described herein. The one or more processors (e.g., processors 724) of smart PV panel 700 of FIG. 7 may perform method 1100 of FIG. 11. Method 1100 may begin at 1102 where a smart panel (e.g., smart panel 700) may identify a total number of additional energy-generation panels (e.g., other PV panels) that are electrically coupled together to form an array. For example, if four panels are coupled together to form an array of PV panels, the smart panel may identify that there are three other panels, and that the array is a four-panel array. At 1104, the smart panel may identify a first electrical configuration for the array. For example, the smart panel may identify that all four panels are connected in series. At 1106, the smart panel may receive performance characteristics of the energy-generation modules in the array. As noted, the performance characteristics may identify a level of performance (e.g., healthy, degrading, a percentage of full performance, etc.) of each individual PV panel or of the entire array.

At 1108, the smart panel may determine a second configuration. The determination may be based at least in part on the electrical performance characteristics and/or an optimal energy output amount. The optimal energy output amount may be determined based at least in part on inverter requirements, grid requirements, best practices, settings, ranges, or efficiency standards. The best practices, setting, and/or ranges may be provided by an installation crew, a user (e.g., homeowner), a programmer or account administrator, or the like. In some examples, the grid requirements may be received from a utility company that requires a particular amount of output to the grid. Further, the inverter requirements may be known based at least in part on a make and/or model of the inverter. At 1110, the smart panel may configure the electrical connectivity of the sockets of the smart panel based at least in part on the second configuration. In other words, the configured arrangement of the connected panels may be changed to change and/or optimize the output of the array.

Figure 12:
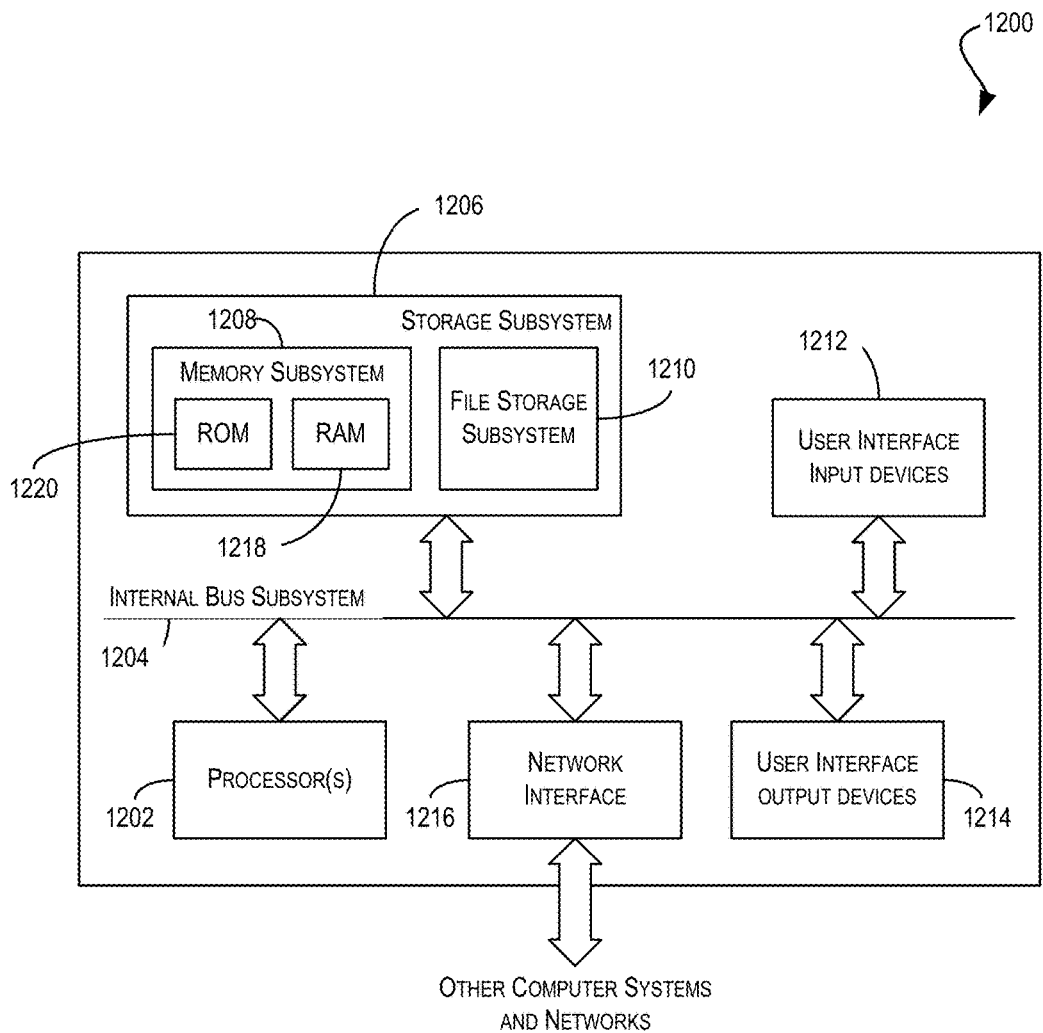
FIG. 12 depicts a simplified block diagram of a computing system for implementing some of the examples described herein, according to at least one example.

FIG. 12 is a simplified block diagram of computer system 1200 according to an embodiment of the present disclosure. Computer system 1200 can be used to implement any of the computer systems/devices (e.g., smart interconnect device 400, smart panels 700, gateway devices 910, and/or service provider computers 906) described with respect to FIGS. 1-9. As shown in FIG. 12, computer system 1200 can include one or more processors 1202 that communicate with a number of peripheral devices via bus subsystem 1204. These peripheral devices can include storage subsystem 1206 (comprising memory subsystem 1208 and file storage subsystem 1210), user interface input devices 1212, user interface output devices 1214, and network interface subsystem 1216.

In some examples, internal bus subsystem 1204 can provide a mechanism for letting the various components and subsystems of computer system 1200 communicate with each other as intended. Although internal bus subsystem 1204 is shown schematically as a single bus, alternative embodiments of the bus subsystem can utilize multiple buses. Additionally, network interface subsystem 1216 can serve as an interface for communicating data between computer system 1200 and other computer systems or networks (e.g., the networks 912 of FIG. 9). Embodiments of network interface subsystem 1216 can include wired interfaces (e.g., Ethernet, CAN, RS232, RS485, etc.) or wireless interfaces (e.g., ZigBee, Wi-Fi, cellular, etc.).

In some cases, user interface input devices 1212 can include a keyboard, pointing devices (e.g., mouse, trackball, touchpad, etc.), a barcode scanner, a touch-screen incorporated into a display, audio input devices (e.g., voice recognition systems, microphones, etc.), and other types of input devices. In general, use of the term "input device" is intended to include all possible types of devices and mechanisms for inputting information into computer system 1200. Additionally, user interface output devices 1214 can include a display subsystem, a printer, or non-visual displays such as audio output devices, etc. The display subsystem can be any known type of display device. In general, use of the term "output device" is intended to include all possible types of devices and mechanisms for outputting information from computer system 1200.

Storage subsystem 1206 can include memory subsystem 1208 and file/disk storage subsystem 1210. Subsystems 1208 and 1210 represent non-transitory computer-readable storage media that can store program code and/or data that provide the functionality of embodiments of the present disclosure. In some embodiments, memory subsystem 1208 can include a number of memories including a main RAM 1218 for storage of instructions and data during program execution and a ROM 1220 in which fixed instructions may be stored. File storage subsystem 1210 can provide persistent (i.e., non-volatile) storage for program and data files, and can include a magnetic or solid-state hard disk drive, an optical drive along with associated removable media (e.g., CD-ROM, DVD, Blu-Ray, etc.), a removable flash memory-based drive or card, and/or other types of storage media known in the art.

It should be appreciated that computer system 1200 is illustrative and not intended to limit embodiments of the present disclosure. Many other configurations having more or fewer components than system 1200 are possible.

Illustrative methods and systems for controlling smart interconnect devices and/or smart panels are described above. Some or all of these systems and methods may, but need not, be implemented at least partially by architectures such as those shown at least in FIGS. 1-9 above. While many of the embodiments are described above with reference to information and/or control signals, it should be understood that any type of electronic content may be managed using these techniques. Further, in the foregoing description, various non-limiting examples were described. For purposes of explanation, specific configurations and details are set forth in order to provide a thorough understanding of the examples. However, it should also be apparent to one skilled in the art that the examples may be practiced without the specific details. Furthermore, well-known features were sometimes omitted or simplified in order not to obscure the example being described.

The various embodiments further can be implemented in a wide variety of operating environments, which in some cases can include one or more user computers, computing devices or processing devices which can be used to operate any of a number of applications. User or client devices can include any of a number of personal computers, such as desktop or laptop computers running a standard operating system, as well as cellular, wireless and handheld devices running mobile software and capable of supporting a number of networking and messaging protocols.

Most embodiments utilize at least one network that would be familiar to those skilled in the art for supporting communications using any of a variety of commercially-available protocols, such as TCP/IP, OSI, FTP, UPnP, NFS, CIFS, and AppleTalk. The network can be, for example, a local area network, a wide-area network, a virtual private network, the Internet, an intranet, an extranet, a public switched telephone network, an infrared network, a wireless network, and any combination thereof.

In embodiments utilizing a network server, the network server can run any of a variety of server or mid-tier applications, including HTTP servers, FTP servers, CGI servers, data servers, Java servers, and business application servers. The server(s) also may be capable of executing programs or scripts in response requests from user devices, such as by executing one or more applications that may be implemented as one or more scripts or programs written in any programming language, such as Java®, C, C# or C++, or any scripting language, such as Perl, Python or TCL, as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch screen or keypad), and at least one output device (e.g., a display device, printer or speaker). Such a system may also include one or more storage devices, such as disk drives, optical storage devices, and solid-state storage devices such as RAM or ROM, as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a non-transitory computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services or other elements located within at least one working memory device, including an operating system and application programs, such as a client application or browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Non-transitory storage media and computer-readable storage media for containing code, or portions of code, can include any appropriate media known or used in the art such as, but not limited to, volatile and non-volatile, removable and non-removable media implemented in any method or technology for storage of information such as computer-readable instructions, data structures, program modules or other data, including RAM, ROM, Electrically Erasable Programmable Read-Only Memory (EEPROM), flash memory or other memory technology, CD-ROM, DVD or other optical storage, magnetic cassettes, magnetic tape, magnetic disk storage or other magnetic storage devices or any other medium which can be used to store the desired information and which can be accessed by the a system device. Based on the disclosure and teachings provided herein, a person of ordinary skill in the art will appreciate other ways and/or methods to implement the various embodiments. However, computer-readable storage media does not include transitory media such as carrier waves or the like.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. The phrase "based on" should be understood to be open-ended, and not limiting in any way, and is intended to be interpreted or otherwise read as "based at least in part on," where appropriate. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate, and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A solar panel, comprising:
   a structure configured to support a plurality of energy-generation cells and including a number of sides, physical connection sockets at corners of the solar panel, and magnetic plates at the corners of the solar panel, each of the physical connection sockets at one of the corners where two adjacent sides of the number of sides meet such that each of the physical connection sockets are structurally embedded with both of the two adjacent sides, and each of the physical connection sockets configured to magnetically attract, via the magnetic plates, and electrically couple to one or more additional solar panels or an inverter;
   a memory for storing computer-executable instructions; and
   a processor configured to access the memory and execute the computer-executable instructions to at least:
      identify a total number of the one or more additional solar panels electrically coupled together at one of the physical connection sockets, the one or more additional solar panels and the solar panel forming a solar array;
      identify a first electrical configuration of the solar array that includes the solar panel and the additional solar panels;
      receive electrical performance characteristics of each solar panel of the solar array;
      determine, based at least in part on the electrical performance characteristics and an optimal energy output amount, a second electrical configuration for the solar array; and
      configure electrical connectivity of the physical connection sockets based at least in part on the determined second electrical configuration.

2. The panel of claim 1, wherein the solar panel comprises a plurality of photo-voltaic cells.

3. The panel of claim 1, further comprising a plurality of connection devices comprising at least one of a relay or a switch, each connection device of the plurality of connection devices configured to connect the one or more additional solar panels for configuring the electrical connectivity.

4. The panel of claim 1, wherein the first electrical configuration of the physical connection sockets comprises a first combination of series and/or parallel arrangements between the solar panel and the one or more additional solar panels.

5. The panel of claim 4, wherein the second electrical configuration of the physical connection sockets comprises a second combination of series and/or parallel arrangements between the solar panel and the one or more additional solar panels that is different from the first combination of series and/or parallel arrangements.

6. The panel of claim 1, further comprising a communication device configured to receive information from a second solar panel.

7. The panel of claim 6, wherein the processor is further configured to execute the computer-executable instructions to at least determine the second electrical configuration based at least in part on the information received from the second solar panel.

8. An energy-generation panel, comprising:
a structure configured to support a plurality of energy-generation cells and including a number of sides, physical connection sockets at corners of the energy-generation panel, and magnetic plates at the corners of the energy-generation panel, each of the physical connection sockets at one of the corners where two adjacent sides of the number of sides meet such that each of the physical connection sockets are structurally embedded with both of the two adjacent sides, and each of the physical connection sockets configured to magnetically attract, via the magnetic plates, and electrically couple to one or more additional energy-generation panels;
a memory for storing computer-executable instructions; and
a processor configured to access the memory and execute the computer-executable instructions to at least:
identify a total number of the one or more additional energy-generation panels electrically coupled together at one of the physical connection sockets, the one or more additional energy-generation panels and the energy-generation panel forming an energy-generation array;
identify a first electrical configuration of the energy-generation array that includes the energy-generation panel and the additional energy-generation panels;
receive electrical performance characteristics of each energy-generation panel of the energy-generation array;
determine, based at least in part on the electrical performance characteristics and an optimal energy output amount, a second electrical configuration for the energy-generation array; and
configure electrical connectivity of the physical connection sockets based at least in part on the determined second electrical configuration.

9. The panel of claim 8, wherein the processor is further configured to execute the computer-executable instructions to at least:
receive electrical performance characteristics of an energy-generation system, the energy-generation system comprising at least the energy-generation panel electrically coupled to the one or more additional energy-generation panels; and
configure electrical connectivity of the physical connection sockets in any combination of series and parallel arrangements based at least in part on the electrical performance characteristics of the energy-generation system.

10. The panel of claim 9, wherein the configured combination of series and parallel arrangements of the physical connection sockets is different from a second combination of series and parallel arrangements of the physical connection sockets that was configured prior to receipt of the electrical performance characteristics.

11. The panel of claim 10, wherein the second combination of series and parallel arrangements is less efficient than the configured combination of series and parallel arrangements associated with the configured electrical connectivity of the physical connection sockets.

12. The panel of claim 9, further comprising means for measuring the electrical performance of the energy-generation system.

13. The panel of claim 9, further comprising a communication device configured to receive information from a second energy-generation panel.

14. The panel of claim 13, wherein the communication device receives the information over a wireless network or through an electrical coupling between the energy-generation panel and the second energy-generation panel.

15. A method for managing connections between an energy-generation panel and one or more additional energy-generation panels electrically coupled to sockets of the energy-generation panel, the energy-generation panel comprising a structure configured to support a plurality of energy-generation cells and including a number of sides, physical connection sockets at corners of the energy-generation panel, and magnetic plates at the corners of the energy-generation panel, each of the physical connection sockets at one of the corners where two adjacent sides of the number of sides meet such that each of the physical connection sockets are structurally embedded with both of the two adjacent sides, and each of the physical connection sockets configured to magnetically attract, via the magnetic plates, and electrically couple to one or more additional energy-generation panels, the method comprising:
identifying a total number of the one or more additional energy-generation panels electrically coupled together at one of the physical connection sockets, the one or more additional energy-generation panels and the energy-generation panel forming an energy-generation array;
identifying a first electrical configuration of the energy-generation array that includes the energy-generation panel and the additional energy-generation panels;
receiving electrical performance characteristics of each energy-generation panel of the energy-generation array;
determining, based at least in part on the electrical performance characteristics and an output factor, an electrical configuration for the physical connection sockets; and
configuring electrical connectivity of the physical connection sockets, based at least in part on the determined electrical configuration, to connect at least a subset of panels that make up the energy-generation array.

16. The method of claim 15, wherein the electrical performance characteristics are received from a server computer configured to measure the electrical performance of the energy-generation array.

17. The method of claim 16, further comprising receiving a request for operational performance of the energy-generation panel from the server computer.

18. The method of claim 17, wherein the request is received based at least in part on a schedule or a trigger.

19. The method of claim 15, wherein the arrangement comprises a combination of series and parallel arrangements.

20. The method of claim 15, wherein the energy generation panel has a first shape that is different from a second shape of at least one of the one or more additional energy-generation panels.

* * * * *